United States Patent
Klaba et al.

(10) Patent No.: US 10,219,400 B2
(45) Date of Patent: Feb. 26, 2019

(54) TRANSPORTABLE AND STACKABLE SERVER RACKS

(71) Applicant: OVH, Roubaix (FR)

(72) Inventors: Miroslaw Klaba, Roubaix (FR); Henri Klaba, Roubaix (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 15/182,051

(22) Filed: Jun. 14, 2016

(65) Prior Publication Data
US 2017/0359918 A1 Dec. 14, 2017

(51) Int. Cl.
| | |
|---|---|
| H05K 5/00 | (2006.01) |
| H05K 5/02 | (2006.01) |
| H05K 7/02 | (2006.01) |
| H05K 7/14 | (2006.01) |
| H05K 7/18 | (2006.01) |
| A47B 87/02 | (2006.01) |
| B60B 33/06 | (2006.01) |

(52) U.S. Cl.
CPC ....... *H05K 7/1489* (2013.01); *A47B 87/0276* (2013.01); *A47B 87/0284* (2013.01); *A47B 87/0292* (2013.01); *B60B 33/063* (2013.01); *H05K 5/0021* (2013.01); *H05K 5/0234* (2013.01); *H05K 5/0247* (2013.01); *H05K 7/023* (2013.01); *H05K 7/1491* (2013.01); *H05K 7/183* (2013.01); *A47B 2210/0051* (2013.01); *H05K 2201/10515* (2013.01)

(58) Field of Classification Search
CPC .... H05K 7/183; H05K 7/1489; H05K 7/1491; H05K 7/18; H05K 7/1488; H05K 7/1485; H05K 7/14; H05K 5/00; H05K 5/02; H05K 5/0217; H05K 5/0234; H05K 5/0247; H05K 2201/10515; H05K 5/0021; H05K 7/023; G06F 1/181; A47B 88/0451; A47B 2210/0051; A47B 2210/0056; A47B 2210/0062; A47B 87/02; A47B 87/0207; A47B 87/0276; A47B 87/0284; A47B 47/0091; A47B 87/0292
USPC ............. 211/26, 188, 194; 312/223.1, 223.2, 312/223.6, 349, 107, 108, 111, 198, 201; 361/724, 727, 735, 729
See application file for complete search history.

(56) References Cited

U.S. PATENT DOCUMENTS

| | | | | |
|---|---|---|---|---|
| 3,743,372 | A | * | 7/1973 | Ruggerone ............ A47B 67/04 312/108 |
| 4,243,279 | A | * | 1/1981 | Ackeret ............ B65D 21/0201 108/64 |

(Continued)

FOREIGN PATENT DOCUMENTS

| | | |
|---|---|---|
| WO | 2010/148429 A1 | 12/2010 |
| WO | 2014/191532 A1 | 12/2014 |

OTHER PUBLICATIONS

International Search Report with regard to the counterpart patent application PCT/EP2017/062916 dated Dec. 12, 2017.

*Primary Examiner* — Jennifer E. Novosad
(74) *Attorney, Agent, or Firm* — BCF LLP

(57) ABSTRACT

A server rack including a bottom panel, a top panel opposite to said bottom panel, a plurality of housing units configured for receiving rack-mountable equipment, the plurality of housing units being horizontally side-by-side arranged between the top panel and the bottom panel, the bottom panel comprising two support rails for supporting the server rack.

21 Claims, 3 Drawing Sheets

(56) References Cited

U.S. PATENT DOCUMENTS

| | | | | |
|---|---|---|---|---|
| D285,986 S * | 10/1986 | Huang | | D6/627 |
| 5,046,789 A * | 9/1991 | Lee | | A47B 87/0276 |
| | | | | 312/108 |
| 5,746,325 A * | 5/1998 | Lee | | G11B 23/0236 |
| | | | | 211/194 |
| 5,775,046 A * | 7/1998 | Fanger | | A47B 81/06 |
| | | | | 108/157.16 |
| 6,050,657 A * | 4/2000 | Hiltzman | | A47B 87/007 |
| | | | | 312/107 |
| 6,541,699 B1 * | 4/2003 | Lindemulder | | H05K 9/0073 |
| | | | | 174/50 |
| 6,820,950 B1 * | 11/2004 | Sun | | A47B 47/042 |
| | | | | 312/108 |
| 7,100,999 B2 * | 9/2006 | Stravitz | | A47F 3/004 |
| | | | | 312/108 |
| 7,111,853 B2 * | 9/2006 | Tracewell | | B62B 3/006 |
| | | | | 280/47.35 |
| 7,350,648 B2 * | 4/2008 | Gerstner | | A47F 1/126 |
| | | | | 206/509 |
| 7,410,289 B2 * | 8/2008 | Hill | | G04D 7/009 |
| | | | | 368/206 |
| 7,575,828 B2 * | 8/2009 | Marraffa | | H01M 2/1077 |
| | | | | 429/100 |
| 9,510,678 B2 * | 12/2016 | Aleisa | | A47B 47/0091 |
| 9,724,820 B2 * | 8/2017 | Parzy | | B25H 3/02 |
| 2002/0046979 A1 | 4/2002 | Larsen et al. | | |
| 2002/0063100 A1 * | 5/2002 | Kwang | | G11B 33/0483 |
| | | | | 211/40 |
| 2002/0093272 A1 * | 7/2002 | Saravis | | A47B 47/0033 |
| | | | | 312/111 |
| 2008/0029467 A1 * | 2/2008 | Colin | | A47F 5/13 |
| | | | | 211/59.2 |
| 2011/0069471 A1 * | 3/2011 | Higson | | H05K 7/183 |
| | | | | 361/829 |
| 2011/0079565 A1 * | 4/2011 | Alli | | A47B 47/042 |
| | | | | 211/36 |
| 2011/0260591 A1 | 10/2011 | Peng et al. | | |
| 2012/0319544 A1 | 12/2012 | Hsiao | | |
| 2013/0208420 A1 * | 8/2013 | Franklin | | H05K 7/1488 |
| | | | | 361/695 |
| 2017/0359918 A1 * | 12/2017 | Klaba | | H05K 7/1489 |

* cited by examiner

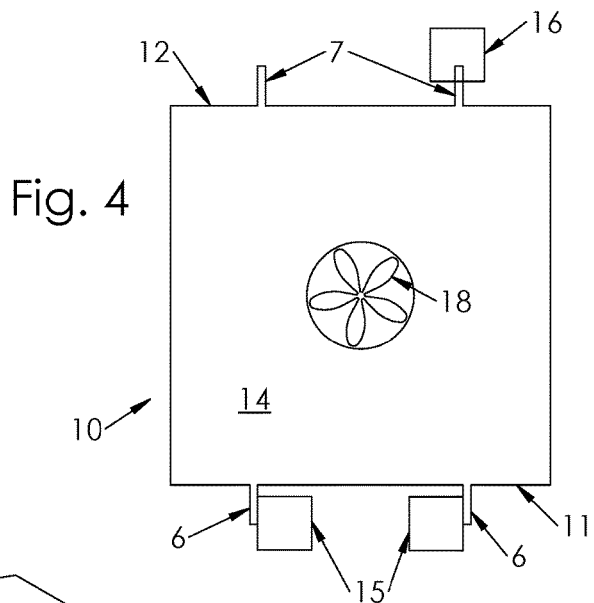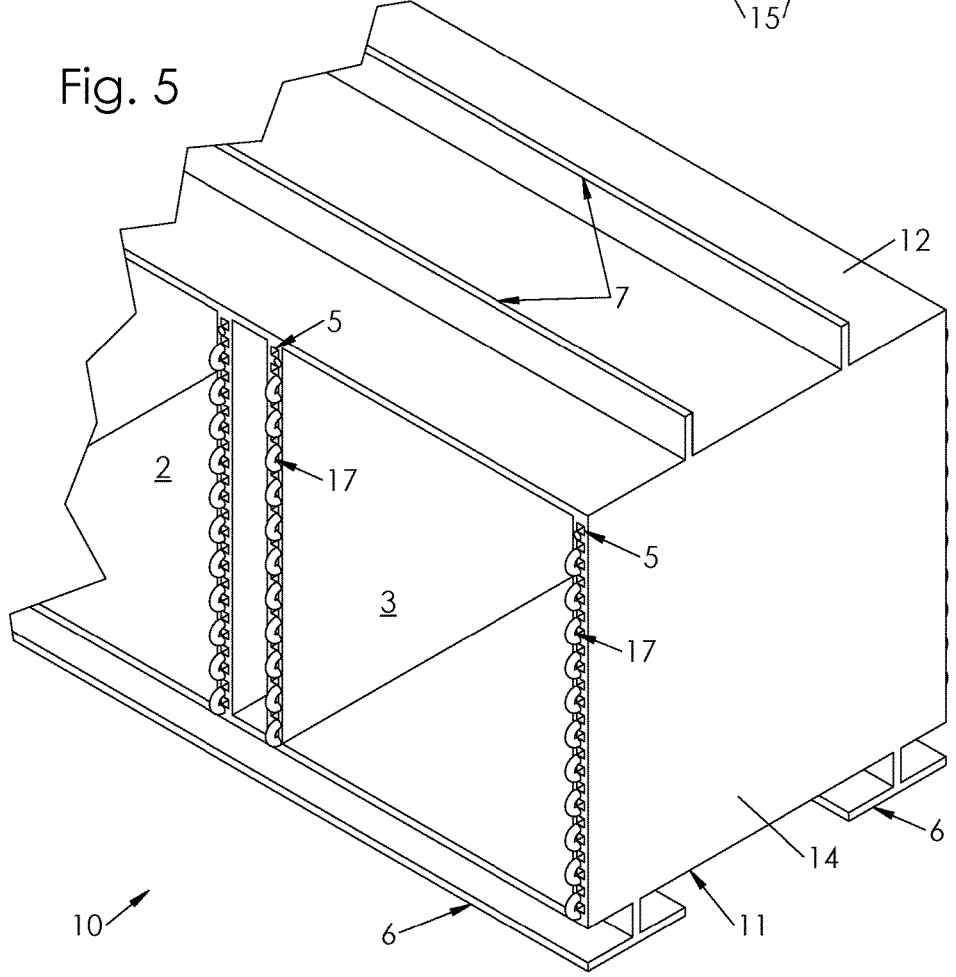

TRANSPORTABLE AND STACKABLE SERVER RACKS

FIELD OF THE INVENTION

The present invention pertains to server racks, and more specifically to transportable and stackable server racks.

BACKGROUND OF THE INVENTION

As used herein, the term server rack is meant broadly and not restrictively, to include any structure or frame configured to simultaneously house multiple data processing equipment such as servers, switches, routers, or similar devices that comply with the server rack mounting space. Server racks, also known as computer rack, or server/computer cabinet (when fitted with doors and usually side panels which might be removable), are generally used in data centers or network rooms.

With the spread of information and communication technologies throughout the world, data center operators may have to manage a plurality of data centers located in different geographical locations such as in different buildings, towns, countries, or even continents.

So as to fill, update, or meet specific needs, a data center operator has regularly to move one or more server racks to a receiving data center, within a receiving data center, or from a data center. Particular attention should be paid during the transportation of such fragile and complex hardware because of the inconvenient and inappropriate structure of current server racks for such operation.

In fact, current server racks (specifically, those compliant with standard EIA-310) are vertically elongated in form with a small support base. Such a structure or frame leads to a server rack with a high center of gravity. Accordingly, commonly available server racks are 19 inches or 23 inches in width and 42 U (multiple of 1.752 inches or one rack unit, referred to as U) in height.

Server racks, which have a high center of gravity, can fall over during their transportation. This problem may arise during, as non-limiting examples, during sudden bracking or when driving up or down a ramp;

during takeoff or landing, when the server rack is transported by a plane;

during vibration, when the sever rack is transported by a boat.

Moreover, when increasing the total number of units U to be housed in the server rack and/or when profiting entirely of the useful height of the server rack, its gravity center moves further up and compromises its transportation.

As a further problem, the safety of operators, and surrounding objects are also concerned. A server rack may weigh several hundred kilograms which cannot be easily handled.

It should also be noted that current server racks are not suitable to be stacked and, consequently, the space thereabove is usually unused. Current server racks are not provided with means permitting to achieve such arrangement.

Accordingly, because of their structure and typically their vertically elongated form, whether the transportation or the stacking of existing server racks is challenging.

SUMMARY

Various embodiments are directed to addressing the effects of one or more of the problems set forth above. The following presents a simplified summary of embodiments in order to provide a basic understanding of some aspects of the various embodiments. This summary is not an exhaustive overview of these various embodiments. It is not intended to identify key of critical elements or to delineate the scope of these various embodiments. Its sole purpose is to present some concepts in a simplified form as a prelude to the more detailed description that is discussed later.

Some embodiments overcome one or more drawbacks of the prior art, by providing a server rack advantageously adapted for facilitating its transportation and stacking.

Some embodiments provide server racks that transportation and stacking could be achieved in the most efficient and secured ways.

Some embodiments provide servers racks which may be securely and safely transported by means of conventional transport means.

Some embodiments provide servers racks which may be securely and safely stacked by means of conventional pallet lifting devices.

Some embodiments provide methods for data centers facility management, including server racks preparation, transportation and integration in appropriate remote locations.

Some embodiments provide a server rack structure/frame with which transport difficulties are minimized and close cooperation with load-handling apparatus is achieved.

Various embodiments relate to server racks including a bottom panel, a top panel opposite to said bottom panel, a plurality of housing units configured for receiving rack-mountable equipment, the plurality of housing units being horizontally side-by-side arranged between the top panel and the bottom panel, the bottom panel comprising two support rails for supporting the server rack.

In accordance with a broad aspect, the two support rails are made integral with the bottom panel.

In accordance with another broad aspect, the two support rails are parallel.

In accordance with another broad aspect, the two supporting rails are on either side of a vertical plane of symmetry for the server rack.

In accordance with another broad aspect, the dimensions of the two support rail and the distance between the two support rails are adapted for engagement by lifting fork arms of a pallet lifting device for lifting the server rack.

In accordance with another broad aspect, at least one of the two support rails has a generally L-shaped transverse section.

In accordance with another broad aspect, at least one of the two support rails has a generally I-shaped transverse section.

In accordance with another broad aspect, at least one of the two support rails has a generally inverted T-shaped transverse section.

In accordance with another broad aspect, the bottom panel comprises lockable and vertically adjustable casters.

In accordance with another broad aspect, the casters are retractable.

In accordance with another broad aspect, the server rack comprises on said top panel two guiding rails configured, when another server rack is stacked thereon, to fit with the two support rails of said another server rack.

In accordance with another broad aspect, guiding rails and or said support rails comprises a stop member configured to lock in a predefined position the said another server rack.

In accordance with another broad aspect, at least one of the said plurality of housing units is in 19-inch rack width.

In accordance with another broad aspect, at least one of the said plurality of housing units is in 21-inch rack width.

In accordance with another broad aspect, the plurality of housing units comprises a first housing unit of 19-inch rack size and a second housing unit of 21-inch rack size.

In accordance with another broad aspect, at least one of the said plurality of housing units is in 23-inch rack width.

In accordance with another broad aspect, at least one of the said plurality of housing units includes a power supply compartment configured to supply rack-mountable equipment received in the housing unit with electric power.

In accordance with another broad aspect, at least one of the said plurality of housing units includes an interconnection compartment configured for permitting intra-connection between rack-mountable equipment received in the housing unit and inter-connection of rack-mountable equipment received in the housing unit with a remote network.

In accordance with another broad aspect, the server rack comprises, on one side of at least one of the said plurality of housing units, a cables channel configured to receive cables permitting the connection of rack-mountable equipment received in the housing unit to the power supply compartment.

In accordance with another broad aspect, the server rack comprises, on one side of at least one of the said plurality of housing units, a cables channel configured to receive cables permitting the connection of rack-mountable equipment received in the housing unit to the interconnection compartment.

In accordance with another broad aspect, the server rack comprises, on one side of at least one of the said plurality of housing units, a cables channel configured to include cooling circuits and or cooling devices.

In accordance with another broad aspect, the server rack comprises three or more housing units.

In accordance with another broad aspect, each housing unit includes two front rack rails for supporting rack-mountable equipment.

In accordance with another broad aspect, front rack rails comprise a plurality of linearly arranged mounting holes through which rack-mountable equipment may be secured to said rack rails.

While the various embodiments are susceptible to various modification and alternative forms, specific embodiments thereof have been shown by way of example in the drawings. It should be understood, however, that the description herein of specific embodiments is not intended to limit the various embodiments to the particular forms disclosed.

It may of course be appreciated that in the development of any such actual embodiments, implementation-specific decisions should be made to achieve the developer's specific goal, such as compliance with system-related and business-related constraints. It will be appreciated that such a development effort might be time consuming but may nevertheless be a routine understanding for those or ordinary skill in the art having the benefit of this disclosure.

DESCRIPTION OF THE DRAWING

The objects, advantages and other features of the present invention will become more apparent from the following disclosure and claims. The following non-restrictive description of preferred embodiments is given for the purpose of exemplification only with reference to the accompanying drawing in which

FIG. 4 is a plan view illustrating a server rack according to a different embodiment;

FIG. 5 is a perspective view illustrating a part of a server rack according to a different embodiment.

DETAILED DESCRIPTION OF ILLUSTRATIVE EMBODIMENTS

Figure 1:
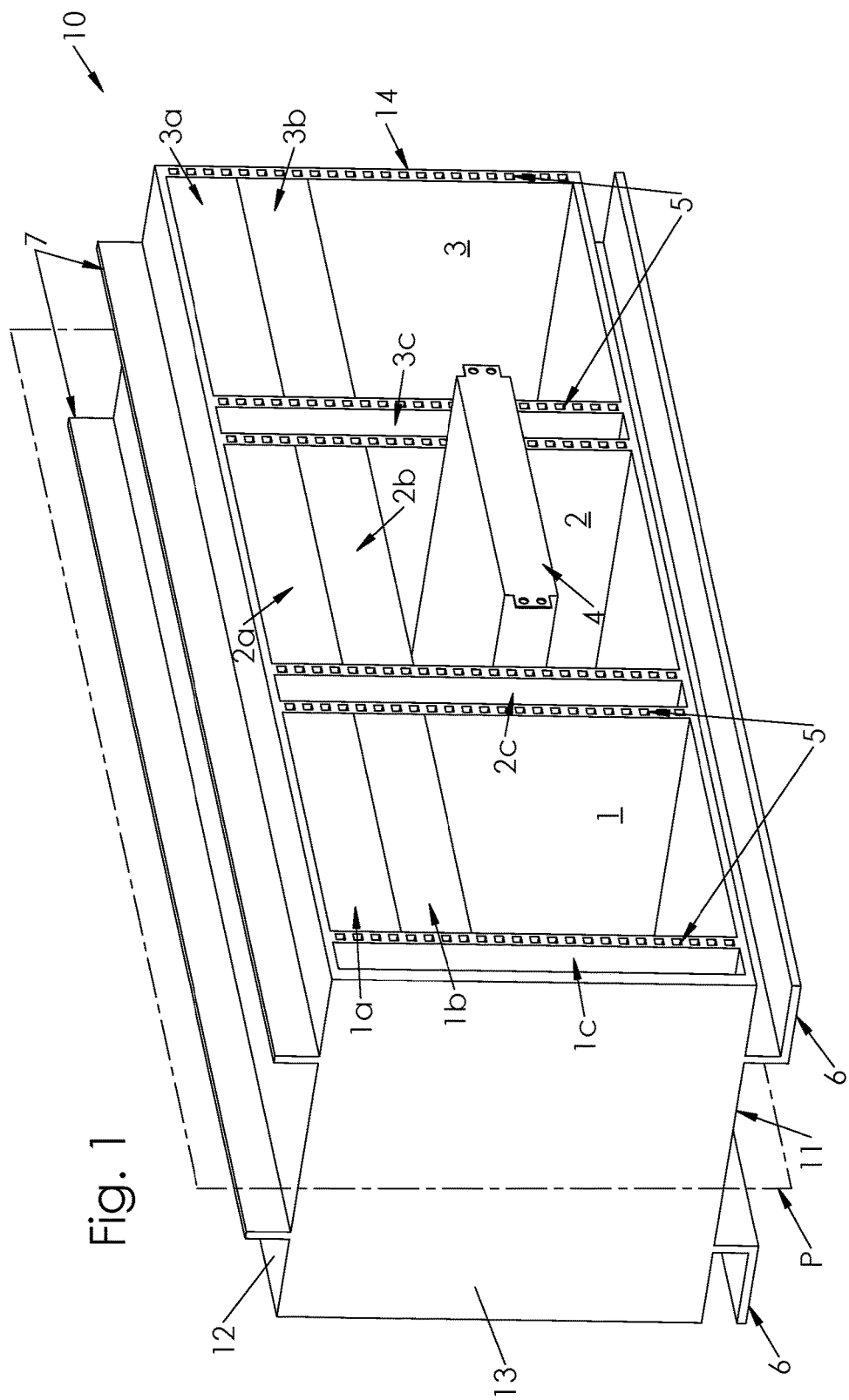
FIG. 1 is a perspective view illustrating a server rack according to various embodiments.

With reference to FIG. 1, there is shown a server rack 10 including a plurality of housing units 1-3. These housing units 1-3 are configured to receive/house rack-mountable equipment 4 such as servers, switches or routers.

The server rack 10 includes a bottom panel 11, a top panel 12 opposite to the bottom panel 11, and two side panels 13-14. In one embodiment, the server rack further includes a back panel (not represented). Moreover, housing units 1-3 may be provided or not with doors (constituting a front panel). Appropriate fastening means permit the assembly of these panels 11-14 to obtain the frame of the server rack 10.

In one embodiment, air vents and/or fans 18 may be designed in the sides panels 13-14 (as shown in FIG. 4), the top panel 12, the bottom panels 11 and/or the back panel (not represented), so as to move cooling air in specified direction and rate.

Housing units 1-3 are arranged horizontally side-by-side between the top panel 12 and the bottom panel 11. More generally, the housing units 1-3 are assembled horizontally between the top panel 12 and the bottom panel 11 so that the server rack 10 has, when in use, a low center of gravity. Accordingly, the server rack 10 has, when in use, a horizontally elongated shape, or a nearly cubic shape.

Advantageously, the horizontal side-by-side arrangement of housing units 1-3 improves the vertical stability of the server rack 10. Horizontally assembled, housing units 1-3 prevents the server rack 10 to keel over during its transportation. In fact, thanks to the horizontal side-by-side arrangement (or distribution) of the housing units 1-3, the center of gravity of the resulting server rack 10 is lower than that of conventional server racks (specifically, those compliant with standard EIA-310) so that the vertical stability of the server rack 10 is improved.

Thanks to the horizontal side-by-side arrangement of housing units 1-3 which leads to a low center of gravity of the server rack 10 and consequently to an improved vertical equilibrium, it is possible to transport the server rack 10 without risk of keeling over.

Each housing units 1-3 includes two vertical front rack rails 5 for supporting rack-mountable equipment 4. In another embodiment, a housing unit 1-3 further includes two vertical back rack rails (not represented) for supporting rack-mountable equipment 4.

Front rack rails 5 comprise a plurality of linearly arranged mounting holes through which rack-mountable equipment 4 may be secured to rack rails 5 by means of appropriate fastening means. Depending on the available number of mounting holes, housing unit 1-3 may be, as non-limitative examples, 42 U-45 U, or 54 U in height.

Housing unit 1-3 may be in 19-inch, 21-inch and/or 23-inch rack width. In one embodiment, the server rack 10 comprises a combination of 19-inch, 21-inch and 23-inch rack sizes. For example, the housing unit 1 is of 19-inch rack size and housing unit 2-3 are of 21-inch rack size.

The housing unit 1-3 includes a power supply compartment 1a, 2a, 3a intended for receiving devices configured to supply rack-mountable equipment 4 mounted on the housing unit 1-3 with electric power. For instances, such power supply compartment 1a, 2a, 3a may include a plurality of receptacles (male and/or female plug) for receiving a plug-and-play power supply, power supply adapters, inverters, AC/DC converters, switches, electrical cables.

The housing unit 1-3 further comprises an interconnection compartment 1b, 2b, 3b intended for receiving devices configured for permitting intra-connection between rack-mountable equipment 4 mounted on the housing unit 1-3 and inter-connection of these rack-mountable equipment 4 with remote networks. For instances, such interconnection compartment 1b, 2b, 3b may include routers, modems, hubs, repeaters, bridges, switches, gateways, proxy servers.

The power supply compartment 1a-3a and the interconnection compartment 1b-3b are vertically spaced within their respective housing units 1-3.

The server rack 10 is provided with a cables channel 1c-3c (a vertical space) on one side of each one of the housing units 1-3 and to which is associated. These cables channels 1c-3c permit the connection, through appropriate cables, of rack-mountable equipment 4 to the power supply compartment 1a-3a and to interconnection compartment 1b-3b. In one embodiment, the cables channel 1c-3c is further configured to include cooling circuits 17 such as cooling fluid flow paths (as shown in FIG. 5). The source of such cooling flow may be housed in at least one of the power supply compartment 1a-3a.

In one embodiment, the side panels of the cables channels 1c-3c include a cooling devices 18 such as air vents and/or fans (as shown in FIG. 4).

In the illustrative example of FIG. 1, the server rack 10 includes three housing units 1-3 arranged horizontally side-by-side between the top panel 12 and the bottom panel 11. Each of these housing unit 1-3 comprises a receiving space for accommodating a plurality of rack-mountable equipment 4 therein, a supply compartment 1a-3a and an interconnection compartment 1b-3b.

Figure 2:
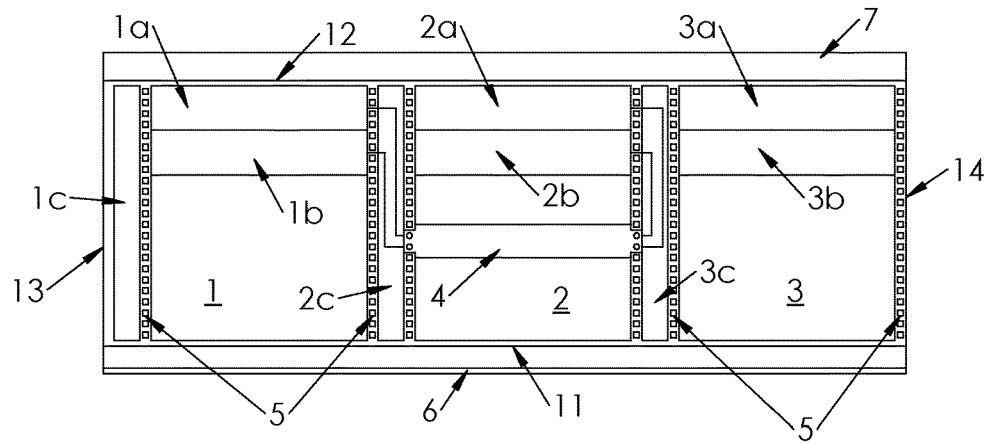
FIG. 2 is a plan view illustrating a server rack according to various embodiments.

In the exemplary embodiment of FIG. 2, cable channels 1c-3c are located in the left-hand side of each housing unit 1-3. In this example, the rack-mountable equipment 4 mounted on housing unit 2 is connected to both power supply compartments 1b, and 2b, and interconnection compartment 1c, and 2c, respectively through the cables channel 2c and 3c.

The bottom panel 12 includes, in its lower face, two support rails 6 for supporting the server rack 10. In one embodiment, the support rails 6 are made integral (i.e. form a single part) with the bottom panel 11.

The two support rails 6 for supporting the server rack 10 are parallel. The two supporting rails 6 are on either side of a vertical median plane P of the server rack 10. In one embodiment, the vertical median plane P is any other vertical plane P of symmetry for the server rack 10. The support rails 6 are spaced toward the median plan P with a distance that assure the stability of the server rack 10.

Moreover, the support rails 6 are adapted for engagement by lifting fork arms of a pallet lifting device (such as hand-pallet truck, electric pallet truck, Reach truck, turret truck, forklift stacker, forklift truck) for lifting the server rack 10. Accordingly, the dimensions and the distance between the two parallel support rails 6 are defined so that fork arms of a pallet lifting device can pass through and securely lift the server rack 10. This distance and the height of support rails 6 are then defined in a compliant manner with standard pallet lifting device fork arms.

It results in that the lower face of the server rack 10 constitutes, with the support rails 6, a sort of an integrated part of a pallet. Thus, the server rack 10 may be held/lift by a forklift truck or any pallet lifting device to a receiving location. Advantageously, forklift truck or more generally pallet lifting devices are commonly used and largely available in commerce and transport fields.

Advantageously, the server rack 10 may be easily moved/transported with common pallet lifting devices such as hand-pallet truck, electric pallet truck, reach truck, turret truck, forklift stacker, forklift truck.

In one embodiment, the lower face of the bottom panel 11 includes, in addition to the two support rails 6, lockable and vertically adjustable casters 15 for supporting the server rack 10. In another embodiment, the lower face of the bottom panel 11 includes casters 15 of the retractable type which may be moved back into the housing defined by the support rails 6 and the bottom panel 11 of the server rack 10 (without preventing the fork arms of a pallet lifting device to pass through the bottom panel 11 of the sever rack 10).

Figure 3:
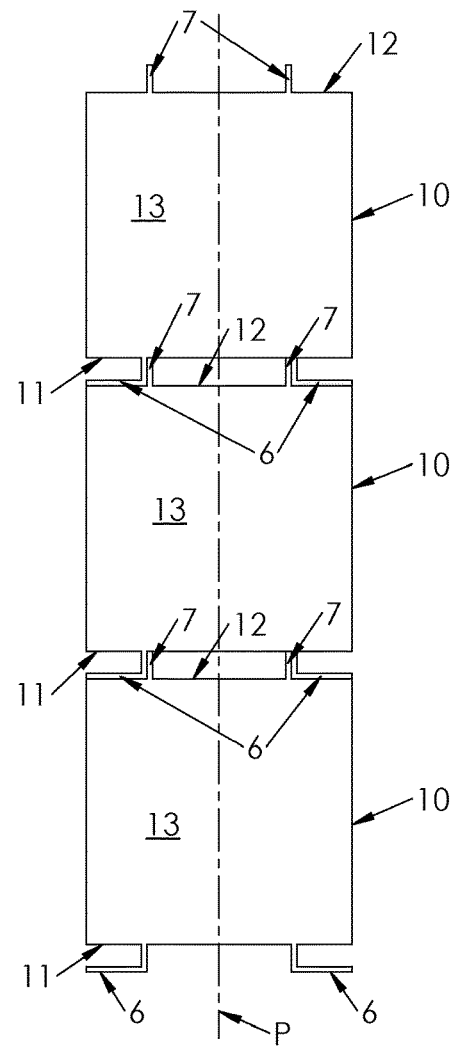
FIG. 3 is a plan view illustrating a plurality of server racks stacked on each other according to various embodiments.

The support rails 6 may have a generally L-shaped (as shown in FIGS. 1 and 3), I-shaped (as shown in FIG. 4), or inverted T-shaped (as shown in FIG. 5) transverse section. An L-shaped or an inverted T-shaped transverse section of the support rails 6 improves the stability of the server rack 10. The two support rails 6 may have, in one embodiment, different transverse section.

More generally, the two support rails 6 may be any support elements projecting from the bottom panel 11 of the server rack 10 for engagement by lifting fork arms of a pallet lifting device for lifting the server rack 10.

The top panel 12 comprises two parallel guiding rails 7. These two guiding rails 7 are intended to facilitate server rack 10 sacking.

The two guiding rails 7 on the top panel 12 (the upper face of the server rack 10) are on either side of a vertical median plane P. The distance between parallel guiding rails 7 is defined so that these two guiding rails 7 can cooperate with the support rails 6 of another server rack stacked thereon. The distance between the guiding rails 7 and the distance between the supporting means 6 presents a little gap intended to facilitate the guiding mechanism and improve the stability of stacked server racks.

In the illustrated embodiment of FIG. 3, the guiding rails 7 are received between the support rails 6. Alternatively, the distance between the guiding rails 7 may be defined so that the support rails 6 can be received between the guiding rails 7.

The guiding rails 7 and the support rails 6 are configured so that, when a first server rack 10 is stacked on a second server rack 10, the support rails 6 of the first server rack 10 closely fit (close physical cooperation) with the guiding rails of the second server rack 10.

In one embodiment, the guiding rails 7 and/or the support rails 6 comprise a stop member 16 configured to lock in a predefined position two stacked server racks. This stop member 16 marks an end of travel of a second server rack stacked on a first server rack. Advantageously, the stop member 16 reinforces the stability of stacked server racks so that a plurality of stacked server racks may be lifted all at once.

The support rails 6, the guiding rails 7 and the panels 11-14 of the server rack 10 are preferably made from a rigid material able to support the weight of a plurality of rack-mountable equipment 4 housed within the plurality of housing units 1-3 and the weight of other server racks 10 that may be stacked thereon.

Advantageously, the guiding rails 7 improve the rigidity of the server rack 10, so that permitting to support others server racks stacked thereon.

Advantageously, the support rails 6 improve the rigidity of the server rack 10, and are configured to safely support the weight of a plurality of fully loaded server racks.

Advantageously, the front rack rails 5 and back rack rails (if exist) are made, in one embodiment, from a rigid material so that preventing the flexion of the top panel 12. Accordingly, the rack rails on either side of each cables channel act, in one embodiment, as girders within the structure of server rack, especially when there are other server racks stacked thereon.

Advantageously, the described above server rack 10 includes required interconnection and power supply components so that it may be entirely prepared (servers mounting, computer cabling and wiring, power supply, cooling, correct functioning testing) before that it reaches a remote receiving data center for immediate use. Then, once it is fully loaded and ready to be integrated within a data center, it has to be transported to the desired location whatever at a low level or to be stacked on another one, without any further configuration.

The server rack 10 may be transported by conventional transport means, and easily held by pallet lifting devices, then securely stacked (as illustrated in FIG. 3) on other server racks. The server rack 10 can thus be quickly set up and made operational.

It is to be noted that references throughout specification and in FIGS. 1-2 to housing units 1, 2, 3, is to be regarded as illustrative instead of limiting because the teachings of this disclosure may be applied to a server rack 10 including two, four, five, six or more housing units. Moreover, this plurality of housing units may be arranged in one or more rows between the bottom panel 11 and the top panel 12. Thus, in one embodiment, two or more housing units may be vertically stacked between the bottom panel 11 and the top panel 12.

The invention claimed is:

1. A server rack including a bottom panel, a top panel opposite to said bottom panel, a plurality of housing units configured for receiving rack-mountable equipment, the plurality of housing units being disposed horizontally between the top panel and the bottom panel and extending side-by-side in a first direction, the top panel comprising two guiding rails, each of the two guiding rails being parallel to the first direction, the two guiding rails being at least partly aligned with one another in the first direction, the bottom panel comprising two support rails, each of the two support rails being parallel to the first direction, the two support rails being at least partly aligned with one another along the first direction, each of the two support rails including a vertical section extending from the bottom panel to a horizontal section of the support rail, the horizontal section defining a contact surface for supporting the server rack, a space for a lifting fork arm of a pallet lifting device being defined between the horizontal section and the bottom panel, the vertical section defining a guide complementary to a corresponding guiding rail of an other server rack when the server rack is stacked on top of the other server rack.

2. The server rack of claim 1, wherein the two support rails are on either side of a vertical plane of symmetry for the server rack.

3. The server rack of claim 1, wherein dimensions of the two support rails and a distance between the two support rails are adapted for engagement by the lifting fork arms of the pallet lifting device for lifting the server rack.

4. The server rack of claim 1, wherein when the server rack is stacked on top of the other server rack, the two guiding rails of the other server rack are received between the two support rails of the server rack such as to closely fit therewith.

5. The server rack of claim 4, wherein each of said guiding rails of the server rack extends substantially along an entire longitudinal length of said top panel.

6. The server rack of claim 1, wherein at least one of said guiding rails of the server rack or said support rails comprises a stop member configured to lock in a predefined position the other server rack.

7. The server rack of claim 1, wherein at least one of said plurality of housing units is in 19-inch rack width.

8. The server rack of claim 1, wherein at least one of said plurality of housing units is in 21-inch rack width.

9. The server rack of claim 1, wherein the plurality of housing units comprises a first housing unit of 19-inch rack size and a second housing unit of 21-inch rack size.

10. The server rack of claim 1, wherein at least one of said plurality of housing units is in 23-inch rack width.

11. The server rack of claim 1, wherein at least one of said plurality of housing units includes a power supply compartment configured to receive devices to supply rack-mountable equipment received in the housing unit with electric power.

12. The server rack of claim 11, further comprising, on one side of at least one of said plurality of housing units, a cables channel configured to receive cables permitting the connection of rack-mountable equipment received in the housing unit to the power supply compartment.

13. The server rack of claim 1, wherein at least one of said plurality of housing units includes an interconnection compartment configured to receive devices for permitting intra-connection between rack-mountable equipment received in the housing unit and inter-connection of the rack-mountable equipment received in the housing unit with a remote network.

14. The server rack of claim 13, further comprising, on one side of at least one of said plurality of housing units, a cables channel configured to receive cables permitting the connection of rack-mountable equipment received in the housing unit to the interconnection compartment.

15. The server rack of claim 1, further comprising, on one side of at least one of said plurality of housing units, a cables channel configured to include cooling circuits or cooling devices.

16. The server rack of claim 1, wherein the plurality of housing units comprises three or more housing units.

17. The server rack of claim 1, wherein each housing unit includes two front rack rails for supporting rack-mountable equipment.

18. The server rack of claim 17, wherein the front rack rails comprise a plurality of linearly arranged mounting holes configured to secure said rack-mountable equipment to said front rack rails.

19. The server rack of claim 1, wherein the two support rails are made integral with the bottom panel.

20. The server rack of claim 1, wherein each of the support rails extends along a majority of a length of the server rack along the first direction.

21. A combination comprising a first server rack according to claim 1 and a second server rack according to claim 1, the first server rack being stacked on top of the second rack so that the horizontal sections of the two support rails of the first server rack rest on the top panel of the second server rack, the guiding rails of the second server rack are received between the vertical sections of the two support rails of the first server rack, the horizontal sections of the two support rails of the second server rack rest on a ground surface.

\* \* \* \* \*